July 13, 1965 R. STEINHOFF 3,195,071

CONSTANT POWER OUTPUT HIGH FREQUENCY TUNING CIRCUIT AND APPARATUS

Filed Aug. 12, 1960 2 Sheets-Sheet 1

INVENTOR.
Reynold Steinhoff
BY Eugene M. Whitacre
ATTORNEY

INVENTOR.
Reynold Steinhoff
BY Eugene M. Whitacre
Attorney 3,195,071

CONSTANT POWER OUTPUT HIGH FREQUENCY TUNING CIRCUIT AND APPARATUS

Reynold Steinhoff, Livingston, N.J., assignor to Radio Corporation of America, a corporation of Delaware Filed Aug. 12, 1960, Ser. No. 49,260
8 Claims. (Cl. 331—107)

This invention relates to high frequency tuning circuits and more particularly to tunable high frequency oscillation generators employing negative resistance diodes.

One form of negative resistance diode, which is known as a tunnel diode, exhibits a positive resistance characteristic for very small forward bias voltages, a negative resistance charatceristic for slightly greater values of forward bias voltages, and a positive resistance characteristic for higher values of forward bias voltages. Stated in another manner, as the forward voltage applied to a voltage controlled negative resistance diode is continuously increased from zero, the diode current first increases to a relatively sharp maximum value, then decreases to a relatively deep and broad minimum, and thereafter again increases.

When a tunnel diode is stably biased in the negative resistance region of its current-voltage characteristic by a suitable biasing source and appropriate reactive circuit means are coupled to the diode, oscillations will be sustained. The frequency of oscillation will be a function of both the reactance of the tunnel diode and the reactance of the reactive circuit means.

The negative resistance effect in tunnel diodes is due to the quantum mechanical tunneling of electric charges. The motion of the electric charges (majority carriers) is essentially at the speed of light in contrast to the relatively slow motion of minority carriers in transistors. As a consequence, tunnel diodes, unlike transistors, are not limited by transit time effects and can operate at microwave frequencies. When operated at microwave frequencies it is desirable to tune the oscillator to the desired frequency of operation by means of distributed circuits such as resonant transmission line structures. To tune the tunnel diode oscillator over a range of frequencies, the length of the transmission line may be varied.

A load may be coupled to the transmission line in any suitable manner to receive energy from the tunnel diode oscillator. Optimum power transfer between the ocillator and the load is achieved when the impedance of the load matches the impedance of the transmission line oscillator at the coupling point. Since tunnel diode oscillators at the present state of the art develop only a small amount of power, it is important to provide the optimum power transfer.

When an oscillator is tuned by varying the length of the transmission line, the standing wave pattern along the line is changed. As a result the impedance of the line at the point where the load is coupled also changes. Thus, the impedance of the load is not matched to that of the transmission line over the entire frequency range of the oscillator, thereby causing substantial inefficiency in the power at some frequencies in the range of frequencies over which the oscillator is to be tuned.

One approach to this problem is to provide a broadband transformer between the load and the oscillator transmission line. However, because of the manner in which the impedance of the transmission line varies with frequency, a suitable broadband transformer is difficult to design, and results in an undesirably large structure. Alternatively, the point on the transmission line where the load is coupled may be adjusted (each time the oscillator is tuned) to provide optimum power transfer. Such a procedure is undesirable because of the additional adjustment which must be made.

Accordingly, it is an object of this invention to provide an improved negative resistance diode oscillator circuit.

It is another object of this invention to provide an improved tunable negative resistance diode oscillator.

Another object of this invention is to provide an improved microwave transmission line oscillator of simple and compact construction which is easily tunable over a broad range of microwave frequencies yet delivers a relatively constant power output to a desired load.

It is a further object of this invention to provide an improved tunable negative resistance diode oscillator circuit with a relatively constant power output over a broad band of oscillator frequencies.

It is a still further object of this invention to provide an improved tunable oscillator circuit which automatically maintains a substantial impedance matching between the oscillator circuit and the load over a relatively wide range of oscillator frequencies.

An oscillator circuit in accordance with the invention includes a transmission line structure comprised of a pair of relatively movable sections. The two sections are positioned so that one may overlie and provide an extension of the other. Thus, longitudinal movement of one section with respect to the other causes the length of the transmission line to be varied.

An active element, such as a tunnel diode biased to exhibit a negative resistance, is connected between the conductors of the first of the line sections. A load is coupled to a fixed point on the second of the line sections where the transmission line structure exhibits an impedance which is substantially equal to that of the load. As a practical matter, the load may be coupled to the transmission line structure through a transmission line of predetermined characteristic impedance.

As the length of the transmission line is varied to tune the oscillator circuit, the point at which the load is coupled remains at a fixed distance from the free end of the second line section. It has been found that this structure is effective to transfer a relatively constant power from the oscillator to the load over the entire frequency range of the oscillator.

The novel features that are considered characteristic of this invention are set forth with particularity in the appended claims. The invention itself, however, both as to its organization and method of operation as well as additional objects and advantages thereof, will best be understood from the following description when read in connection with the accompanying drawings, in which:

Figure 1:
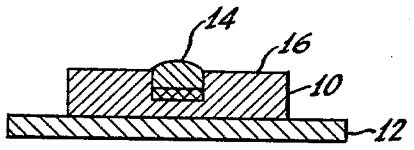
FIGURE 1 is a sectional view of a typical negative resistance diode which may be used in circuits embodying the invention.

Reference is now made to FIGURE 1 which is a diagrammatic sectional view of a typical negative resistance diode that may be used in the arrangement of the invention. By way of example, Leo Esaki, Physical Review, vol. 109, page 603, 1958, has reported a thin or abrupt junction diode exhibiting a negative resistance over a region of low forward bias voltages. The diode was prepared with a semiconductor having a free charge carrier concentration several orders of magnitude higher than that used in conventional diodes.

A diode which was constructed and could be used in practicing the invention includes a single crystal bar of n-type germanium which is doped with arsenic to have a donor concentration of $4.0 \times 10^{19}$ cm.$^{-3}$ by methods known in the semiconductor art. This may be accomplished, for example, by pulling a crystal from molten germanium containing the requisite concentration of arsenic. A wafer 10 is cut from the bar along the 111 plane, i.e. a plane perpendicular to the 111 crystallographic axis of the crystal. The wafer 10 is etched to a thickness of about 2 mils with a conventional etch solution. A major surface of this wafer 10 is soldered to a strip 12 of a conductor, such as nickel, with a conventional lead-tin-arsenic solder, to provide a non-rectifying contact between the wafer 10 and the strip 12. The nickel strip 12 serves eventually as a base lead. A small diameter dot 14 of 99 percent by weight indium, 0.5 percent by weight zinc and 0.5 percent by weight gallium is placed with a small amount of a commercial flux on the free surface 16 of the germanium wafer 10 and then heated to a temperature in the neighborhood of 450° C. for a minute in an atmosphere of dry hydrogen to alloy a portion of the dot 14 to the free surface 16 of the wafer 10, and then cooled rapidly. In the alloying step, the unit is heated and cooled as rapidly as possible so as to produce an abrupt p-n junction. The unit is then given a final dip etch for 5 seconds in a slow iodide etch solution, followed by rinsing in distilled water. A suitable slow iodide etch is prepared by mixing one drop of a solution comprising 0.55 gram potassium iodide, and 100 cm.$^3$ water in 10 cm.$^3$ concentrated acetic acid, and 100 cm.$^3$ concentrated hydrofluoric acid. A pigtail connection may be soldered to the dot where the device is to be used at ordinary frequencies. Where the device is to be used at high frequencies, contact may be made to the dot with a suitable low impedance connection.

Other semiconductors may be used instead of germanium, particularly silicon and the III–V compounds. A III–V compound is a compound composed of an element from Group III and an element from Group V of the Periodic Table of Chemical Elements, such as gallium arsenide, indium arsenide and indium antimonide. Where III–V compounds are used, the P and N type impurities ordinarily used in those compounds are also used to form the diode described. Thus, sulfur is a suitable n-type impurity and zinc a suitable p-type impurity which is also suitable for alloying.

Figure 2:
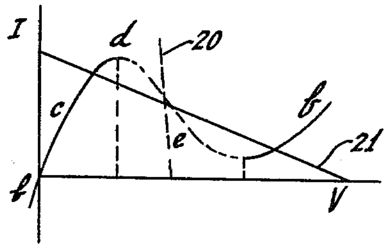
FIGURE 2 is a graph illustrating the current-voltage characteristic of a negative resistance diode of the type shown in FIGURE 1.

The current-voltage characteristic of a typical diode suitable for use with circuits embodying the invention is shown in FIGURE 2. The current scales depend on area and doping of the junction, but representative currents are in the milliampere range.

For a small voltage in the back direction, the back current of the diode increases as a function of voltage as indicated by the region *b* of FIGURE 2.

For small forward bias voltages, the characteristic is substantially linear (FIGURE 2, region *c*). The forward current results due to quantum mechanical tunneling. At higher forward bias voltages, the forward current due to tunneling reaches a maximum (region *d*, FIGURE 2), and then begins to decrease. The current (FIGURE 2, region *e*) reaches a minimum, and then rises until eventually normal injection over the barrier becomes dominant and the characteristic turns into the usual forward behavior (region *f*, FIGURE 2).

The negative resistance of the diode is the incremental change in voltage divided by the incremental change in current, or the reciprocal slope, of the region *e* of the FIGURE 2. Biasing the diode for stable operation in the negative resistance region of its characteristic requires a suitable voltage source having a smaller internal impedance than the negative resistance of the diode. Such a voltage source has a D.C. load line 20 as indicated in FIGURE 2, which is characterized by a current-voltage relationship which has a steeper slope than the negative slope of the diode characteristic and intersects the diode characteristic at only a single point. If the voltage source has an internal resistance which is greater than the magnitude of the negative resistance of the diode, the source would have a load line 21 with a smaller slope than the negative slope of the diode characteristic as indicated in FIGURE 2 and would intersect the diode characteristic curve at three points. Under the latter condition the diode is not stably biased in the negative resistance region. This is because an incremental change in current through the diode due to transient or noise current, or the like, produces a regenerative reaction which causes the diode to assume one of its two stable states represented by the intersection of the load line 21 with the positive resistance portions of the diode characteristic curve.

Figure 3:
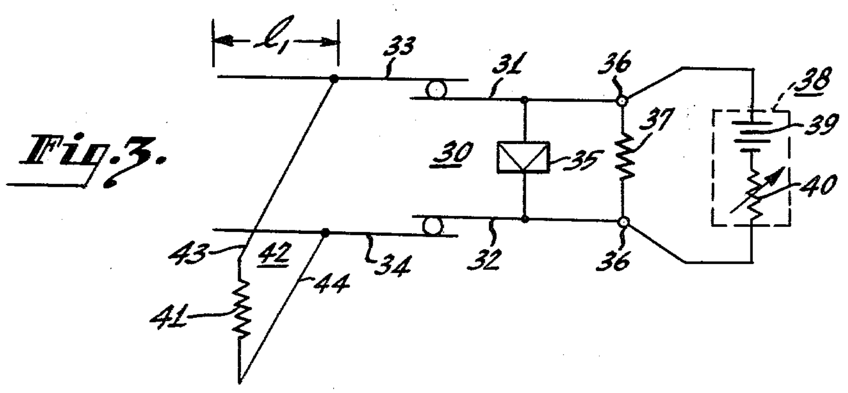
FIGURE 3 is a schematic circuit diagram of a tunable oscillator in accordance with the invention.

Referring to FIGURE 3, a negative resistance oscillator circuit in accordance with the invention includes a tunable transmission line 30 having a first section comprising a pair of parallel conductors 31 and 32 and a second section comprising a pair of parallel conductors 33 and 34 that overlie and provide physical extensions of the conductors 31 and 32. The first and second transmission line sections are relatively movable so that the physical length of the line may be varied to tune the oscillator over a range of frequencies.

A tunnel diode 35 is connected between the conductors 31 and 32 at a distance from the end 36 thereof which is approximately equal to a quarter wavelength at the frequency at the center of the range over which the oscillator is tunable. The characteristic admittance of the resonant transmission line 30 is chosen to have a magnitude approximately equal to the absolute value of the negative conductance of the tunnel diode 35. A bias stabilizing resistor 37 is connected between the conductors 31 and 32 at the end 36. The stabilizing resistor 37, which may comprise a block of germanium or graphite, or the like, is selected to have a lower resistance value than the minimum negative resistance of the tunnel diode 35. The biasing circuit including the resistor 37 does not appreciably load the diode 35 because of the quarter wave line disposed therebetween. A suitable biasing voltage source 38, which may comprise a battery 39 and a variable series resistor 40, is connected across the stabilizing resistor 37 to bias the tunnel diode 35 to operate in the negative resistance portion of its current-voltage characteristic.

Oscillatory power developed in the circuit is coupled to a load 41 by means of a load transmission line 42 which includes a pair of parallel conductors 43 and 44. The load transmission line conductors 43 and 44 are fixedly connected to the conductors 33 and 34 of the second section of the resonant transmission line 30 at a distance $l_1$ from the open end thereof. The distance $l_1$ is selected by finding the point on the conductors 33 and 34 where the impedance of the transmission line 30 matches the effective impedance presented by the load transmission line 42 at the center frequency of the range over which the oscillator is tunable. The characteristic impedance of the load transmission line 42 is chosen to be approximately 50 ohms and is terminated in a load 41 which is approximately equal to the characteristic impedance of the line so that no standing wave pattern is created. Thus the length of the load trans mission line 42 is immaterial.

In operation, the resistor 40 is adjusted to bias the diode 35 to operate in the negative resistance region of its characteristic. The combined positive conductances appearing across the diode 35 due to the biasing and load circuits are designed to be less than the negative conductance of the diode. In this regard it should be noted that the characteristic impedance of the transmission line section to the right of the diode, as shown in FIGURE 1, need not be the same as that to the left of the diode. However, good tuning is obtained if the negative diode conductance equals the characteristic conductance of the transmission line section to the left of the diode.

As the second section of the transmission line 30 is moved longitudinally to tune the oscillator, the load transmission line 42 is always maintained a fixed distance $l_1$ from the open end of the resonant line 30. It has been found that the fixed coupling point provides excellent impedance matching and a relatively constant power output from the oscillator throughout the range of frequencies over which the oscillator is tunable. The exact reason for the optimum matching point remaining nearly a fixed distance from the open end of the resonant transmission line 30 is not known.

Figure 4:
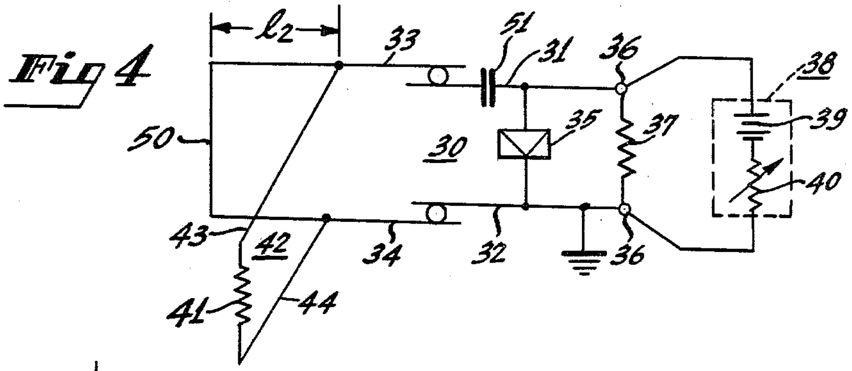
FIGURE 4 is a schematic circuit diagram of another tunable oscillator embodying the invention.

Reference is now made to FIGURE 4 wherein the same reference numerals have been given to components which are like those in FIGURE 3. The embodiment of the invention shown in FIGURE 4 differs from that in FIGURE 3 in the manner in which the transmission line 30 is terminated to create a resonant line. A shorting bar 50 is connected between the conductors 33 and 34 at the previously open end of the transmission line 30. A capacitor 51, which has a low reactance throughout the range of frequencies over which the oscillator is tunable is inserted in the conductor 31 of the transmission line 30 to prevent short circuiting the biasing voltage source 38. The conductor 32 is connected to a point of reference potential or ground, and may, if desired, comprise a unitary ground plane. The load transmission line 42 is fixedly connected to the movable resonant transmission line 30 conductors 33 and 34 at the optimum matching point which is at a distance $l_2$ from the shorting bar 50. The operation of this embodiment is similar to that of FIGURE 3.

Figure 5:
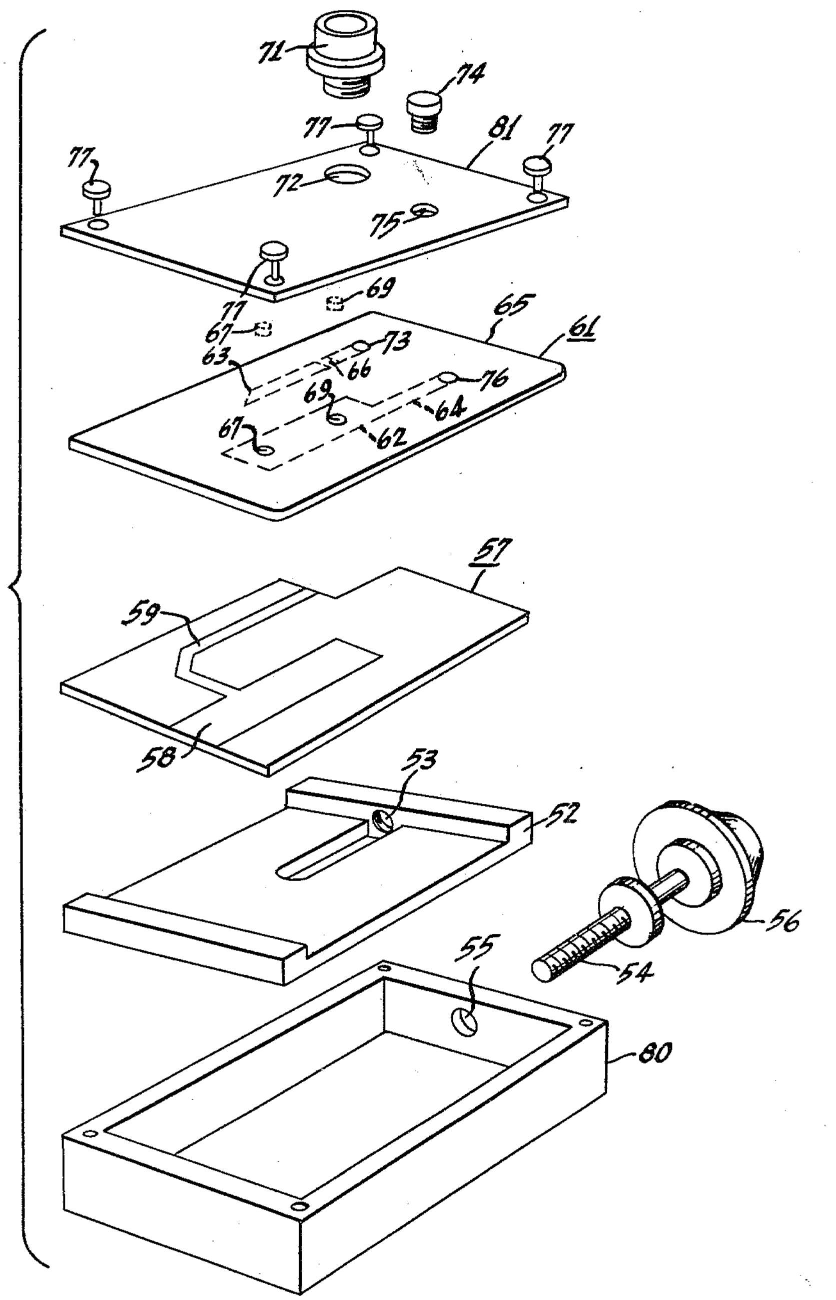
FIGURE 5 is an exploded view of the physical construction of a tunnel diode oscillator in accordance with the invention; and, FIGURE 6 is a graph illustrating the power output-vs.-frequency of the oscillator shown in FIGURE 5.

Referring to FIGURE 5, which is an exploded view of the physical construction of a tunable oscillator in accordance with the invention, the tunnel diode oscillator includes a casing having a substantially rectangular chassis 80 and a cover 81 both of a conductive material such as aluminum. The casing encloses the oscillator circuits and prevents radiation of oscillatory energy.

A slidably movable frame 52, of a suitable insulating material such as polystyrene, is dimensioned to be received for sliding movement within and along the length of the chassis 50. The frame 52 is provided with a tapped hole 53 for receiving a tuning control screw 54, of polystyrene or the like, that extends through an aperture 55 in one end of the chassis 50. A knob 56 which may have suitable calibrated indicia thereon is mounted on the shaft of the tuning control screw 54.

The frame 52 is recessed to snugly receive and carry a circuit board 57 having a conductive pattern thereon that defines the movable section 58 of the oscillator transmission line, and a power output coupling conductor 59 that is connected to the movable section of the oscillator transmission line at the optimum impedance matching point. If desired, the conductive pattern could be applied directly to the frame 52 by any suitable process.

A second circuit board 61, made of insulating material, has a conductive pattern on one side thereof (shown dotted) that defines the fixed section 62 of the oscillator transmission line and a power output coupling conductor 63. The fixed section 62 of the oscillator transmission line is provided with a conductive extension 64 through which energizing potential may be applied to the oscillator transmission line. The width of the conductive extension 64 is small relative to that of the transmission line sections 58 and 62 so that the impedance of the extension 64 will be high enough to prevent loading of the transmission line. The power output coupling conductor 63 is etched to form a gap 66. The gap 66 is suitably coated with an insulating material, is then coated with conductive material so as to form a capacitive gap of low reactance throughout the range of frequencies over which the oscillator is tunable thereby providing D.C. isolation of the termination of the load transmission line from the energizing potential. The opposite side of the circuit board 61 is coated with a conductive material to provide a ground plane 65 for both the oscillator and power output coupling conductors.

The circuit board 61 is dimensioned to fit snugly within the chassis 80 so no movement is permitted. The fixed section 62 of the oscillator overlies and makes contact with the movable section 58. In like manner the fixed section 63 of the power output coupling conductors overlies and contacts the movable section 59. In the embodiment shown, the power output coupling conductors are dimensioned to form a 50 ohm transmission line whereas the oscillator transmission line has a characteristic impedance of 10 ohms.

A tunnel diode 67 and a stabilizing resistor 69 are suitably mounted in the circuit board 61 to make electrical contact between the ground plane 65 and the fixed section 62 of the oscillator transmission line. The stabilizing resistor 69 is positioned near the end of the fixed section 62 and the tunnel diode 67 is positioned a distance from the resistor 69 substantially equal to one quarter of a wavelength at the center frequency of the range of frequencies over which the oscillator is tunable.

A fitting 71 for a 50 ohm coaxial transmission line is mounted in an aperture 72 in the cover 81 of the casing. The fitting 71 has an outer conductor that makes electrical contact with the ground plane 65, and an inner conductor that extends through an aperture 73 in the circuit board 61 and connects to the fixed section 63 of the power output coupling conductor.

A coaxial fitting 74 for connection to a D.C. biasing source is mounted in an aperture 75 in the cover 81. The outer conductor makes electrical contact with the ground plane 65 and the inner conductor is connected through an aperture 76 to the conductive extension 64 of the oscillating transmission line. The positive and negative terminals of a D.C. biasing source, not shown, are connected to the inner and outer conductors respectively of the fitting 74 to bias the tunnel diode to operate in the negative resistance portion of its current-voltage characteristic.

A plurality of screws 77 are provided to fasten the cover 81 to the chassis 55 and thereby enclose and support the oscillator circuit components within the casing.

When enclosed within the casing, the conductive sections 62 and 63 of the circuit board 61 makes electrical contact respectively with the conductive sections 58 and 59 of the circuit board 57. By rotating the knob 56, the frame 52 and the circuit board 57 is moved longitudinally with respect to the circuit board 61 to change the length of the oscillator transmission line and thereby tune the oscillator to the desired frequency.

At the high frequency of the oscillator tuning range, the movable transmission line section 58 is in registry with the fixed section 62. Thus the frequency of oscillation is determined by the length of the section 58 between the diode 67 and the open end of the line together with the susceptances of the diode and biasing circuit. At the low frequency end of the range, only a portion of the movable section 58 overlies the fixed section 62, and the longer line tunes the oscillator to a lower frequency.

The output coupling connection 71 is always maintained a fixed distance from the open end of the movable section 58 of the oscillator transmission line thereby providing substantially optimum impedance matching throughout the range of frequencies over which the oscillator is tunable. Relatively constant and maximum power will thereby be transferred to a load.

In a specific oscillator tunable over a range of 1050 megacycles to 1350 megacycles, the transmission line sections were etched from a portion of microstrip transmission line with the fixed transmission line section 62 being 1" wide and 2.150" long with the tunnel diode 67 positioned $1\frac{3}{16}''$ from the stabilization resistor 69. The movable transmission line section was 1" wide and 2.480" long with the power output coupling conductor 59 connected .550" from the open end of the line. The length of the power output coupling conductors 59 and 63 is not critical, but these conductors were $\frac{3}{16}''$ wide to provide the 50 ohm impedance output transmission line. The particular diode used had a minimum negative resistance of 12.2 ohms and the stabilizing resistor was 8 ohms.

Figure 6:
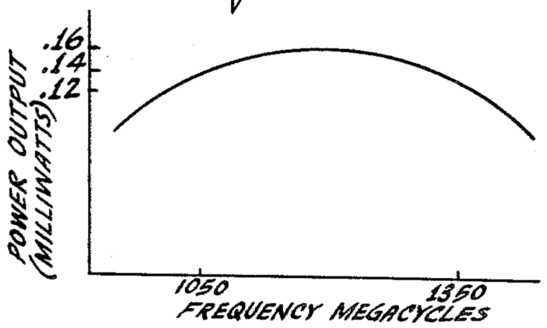

The power output of this oscillator over its range of operating frequencies may be seen by referring to FIGURE 6. Over a frequency range of approximately 1050 to 1350 megacycles, the power output does not vary more than .02 milliwatt from the maximum power output of .14 milliwatt at the mid frequency point.

In accordance with the invention, a tunable tunnel diode oscillator is provided which is compact in construction and provides substantially optimum and relatively constant power output over a broad band of microwave frequencies without the necessity of including expensive broadband transformers to maintain optimum power transfer to a load, or alternatively of providing separate tuning and power optimizing controls.

What is claimed is:

1. A high frequency oscillator tunable over a range of frequencies about a predetermined center frequency comprising in combination a negative resistance diode, a resonant transmission line coupled to said diode, means for changing the physical length of said resonant transmission line to tune said oscillator, a biasing resistor coupled to one end of said transmission line to bias said diode to exhibit a negative resistance, and power output coupling means fixedly coupled to said transmission line at a given distance from the other end of said transmission line to provide a relatively constant power output from said oscillator throughout said range of frequencies, said diode coupled to said resonant transmission line at a distance from said resistor that is substantially equal to one-quarter of a wavelength at said predetermined center frequency.

2. A high frequency oscillator tunable over a range of frequencies about a predetermined center frequency comprising a transmission line including a first fixed transmission line section and a second transmission line section that is movable with respect to said fixed section and provides a physical extension thereof of variable length, a resistor coupled to one end of said fixed transmission line section, a negative resistance diode coupled to said fixed transmission line section at a distance from said resistor that is one quarter of a wavelength at the center frequency of the range of frequencies over which the oscillator is tunable, said resistor having a resistance value smaller than the absolute value of the minimum negative resistance of said diode to bias said diode to exhibit a negative resistance, and power output means coupled to said second transmission line section at a fixed distance from the end thereof to provide substantial impedance matching between said transmission line and said power output means throughout said range of frequencies.

3. A tunable high frequency transmission line comprising a first circuit board having a conductive ground plane on one side thereof and a conductor on the other side thereof defining a fixed portion of said transmission line, a second circuit board having a conductor on one side thereof defining a movable portion of said transmission line, said second circuit board mounted for movement with respect to said first circuit board in a manner that the conductor on said second circuit board is in registry with and provides an extension of variable length of the conductor on said first circuit board to tune said transmission line to a desired frequency within a predetermined range of frequencies, and load means connected to the conductor on said second transmission line section at a fixed distance from one end thereof providing an approximate matching point between said transmission line and said load means throughout said range of frequencies.

4. A tunable high frequency transmission line comprising a first circuit board having a conductive ground plane on one side thereof, a pair of conductors on the other side thereof defining fixed sections of a pair of transmission lines, a second circuit board having first and second conductors on one side thereof defining movable portions of said transmission lines, means for mounting second circuit board for movement with respect to said first circuit board in a manner that the conductors on said second circuit board are in registry with and provide extensions of variable lengths of the conductors on said first circuit board, and a third conductor on said second circuit board coupling said first conductor to said second conductor at a predetermined distance from one of the ends of said second conductor so that the power coupled to said load from said transmission line is approximately constant throughout a predetermined range of frequencies.

5. A high frequency oscillator tunable over a range of frequencies about a predetermined center frequency comprising a casing, an insulator frame mounted within said casing and dimensioned for slidable movement therein, means accessible from outside said casing for moving said frame longitudinally within said casing, a first circuit board having a first and a second conductor on one side thereon, a third conductor connecting said first and second conductors, said first circuit board mounted on said insulator frame for movement therewith, a second circuit board having a ground plane on one side thereof and a fourth and a fifth conductor on the other side thereof, said second circuit board mounted on said first circuit board such that said first and fourth conductors are in registry to form one conductor of a first transmission line having a characteristic impedance of 10 ohms, the other conductor of which is said ground plane, said second and fifth conductors also being in registry to form one conductor of a second transmission line having a characteristic impedance of 50 ohms, the other conductor of which is said ground plane, the mounting permitting said frame to move said first circuit board to vary the lengths of said transmission lines, a resistor mounted within said second circuit board between said fourth conductor and said ground plane of said first transmission line at one end of said fourth conductor, a tunnel diode mounted within said second circuit board between said fourth conductor and said ground plane of said first transmission line at a distance from said resistor which is substantially equal to one quarter of a wavelength at said predetermined center frequency, said resistor having a value which is smaller than the absolute value of the minimum negative resistance of said diode, a coaxial biasing terminal mounted through said casing to make electrical contact with said ground plane and said fourth conductor, a coaxial power output connector mounted through said casing to make electrical contact with said ground plane and said fifth conductors, said third conductor connecting said second transmission line to said first transmission line at a point where the characteristic impedance of said second transmission line matches the impedance of said first transmission line.

6. A transmission line oscillator tunable over a range of frequencies about a predetermined center frequency comprising a fixed transmission line section, a second transmission line section that is movable with respect to said fixed section and provides a physical extension thereof of variable length, said transmission line sections defining a resonant transmission line having a given characteristic admittance, a resistor coupled to one end of said fixed transmission line section, a negative resistance diode having a negative conductance substantially equal to said characteristics admittance coupled to said fixed transmission line section at a distance from said resistor that is substantially one quarter of a wavelength at the center frequency of the range of frequencies over which the oscillator is tunable, said resistor having a resistance value smaller than the absolute value of the minimum negative resistance of said diode to bias said diode to exhibit a negative resistance, a load transmission line having a given characteristic impedance fixedly coupled to said second transmission line section of said resonant transmission line at a given distance from the end thereof, said given distance being approximately the point of optimum match between the characteristic impedance of said load transmission and the impedance of said resonant transmission line throughout said range of frequencies.

7. In a high frequency circuit tunable over a range of frequencies, the combination comprising, a transmission line including, a first fixed transmission line section and a second transmission line section movable with respect to said first fixed section to provide a variable length composite transmission line section so that said transmission line is resonant at a frequency which is a function of the length of said composite transmission line section, and power output coupling means connected to said second transmission line section at a fixed distance from one end thereof to provide a relatively constant output power throughout said range of frequencies.

8. A high frequency oscillator tunable over a range of frequencies comprising in combination, a resonant transmission line including first and second transmission line conductors having a predetermined length, means respectively coupled to said first and second transmission line conductors to provide a variable length transmission line conductor extension for at least one of said first and second conductors to vary the length of said transmission line whereby said transmission line is tuned at a desired frequency within said frequency range, an active circuit element coupled to said transmission line near one end thereof, and power output means coupled to said variable length transmission line extension means at a fixed distance from the opposite end of said transmission line to provide a relatively constant power output throughout said range of frequencies.

References Cited by the Examiner

UNITED STATES PATENTS

| | | | |
|---|---|---|---|
| 2,405,229 | 8/46 | Mueller et al. | 331—99 |
| 2,419,985 | 5/47 | Brown | 333—84 |
| 2,738,422 | 3/56 | Koros | 331—97 |
| 2,961,622 | 11/60 | Sommers | 333—84 |

FOREIGN PATENTS

| | | |
|---|---|---|
| 198,757 | 6/23 | Great Britain. |
| 653,249 | 9/51 | Great Britain. |

OTHER REFERENCES

Reprint from Electronic and Communications, June 1960, by Craven, "Stripline Provides Components Quickly and Cheaply."

Sommers: Proceedings of the IRE, pages 1201–1206, July 1959.

ROY LAKE, *Primary Examiner.*

GEORGE N. WESTBY, JOHN KOMINSKI, *Examiners.*